(12) United States Patent
Byun (10) Patent No.: US 8,558,829 B2
(45) Date of Patent: Oct. 15, 2013

(54) ORGANIC LIGHT EMITTING DISPLAY DEVICE AND DRIVING METHOD THEREOF

(75) Inventor: Seungchan Byun, Incheon (KR)

(73) Assignee: LG Display Co., Ltd., Seoul (KR)

( * ) Notice: Subject to any disclaimer, the term of this patent is extended or adjusted under 35 U.S.C. 154(b) by 311 days.

(21) Appl. No.: 12/828,819

(22) Filed: Jul. 1, 2010

(65) Prior Publication Data

US 2011/0157152 A1   Jun. 30, 2011

(30) Foreign Application Priority Data

Dec. 29, 2009   (KR) .................. 10-2009-0132960

(51) Int. Cl.
*G09G 3/20* (2006.01)
(52) U.S. Cl.
USPC ............................................. 345/214; 345/55
(58) Field of Classification Search
USPC ............... 345/214, 55, 589, 81, 212; 348/673
See application file for complete search history.

(56) References Cited

U.S. PATENT DOCUMENTS

| | | | |
|---|---|---|---|
| 2003/0071821 A1* | 4/2003 | Sundahl et al. | 345/589 |
| 2005/0052350 A1* | 3/2005 | Mizukoshi et al. | 345/55 |
| 2005/0110906 A1* | 5/2005 | Lee et al. | 348/673 |
| 2008/0158218 A1* | 7/2008 | Kim | 345/212 |
| 2010/0149162 A1* | 6/2010 | Park et al. | 345/212 |
| 2010/0171733 A1 | 7/2010 | Kobayashi | |

FOREIGN PATENT DOCUMENTS

KR   1020090118081 A   11/2009

OTHER PUBLICATIONS

Korean Office Action dated May 16, 2013, issued in Korean Patent Application No. 10-2009-0132960.

* cited by examiner

*Primary Examiner* — Quan-Zhen Wang
*Assistant Examiner* — Yuk Chow
(74) *Attorney, Agent, or Firm* — Morgan, Lewis & Bockius LLP (57) ABSTRACT

An organic light emitting display (OLED) device comprises: an estimated current calculation unit configured to estimate an increase estimated current value having at least one increased gray level and a decrease estimated current value having at least one decreased gray level with respect to current flowing cross an element; a current measurement unit configured to measure the current flowing across the element to generate a measured current value; and a luminance adjustment unit configured to compare the values supplied from the estimated current calculation unit and the current measurement unit and increase the luminance when the value inputted through the estimated current calculation unit is high and decrease the luminance when the value inputted through the estimated current calculation unit is low.

11 Claims, 7 Drawing Sheets

ORGANIC LIGHT EMITTING DISPLAY DEVICE AND DRIVING METHOD THEREOF

This application claims the benefit of Korean Patent Application No. 10-2009-0132960 filed on Dec. 29, 2009, which is hereby incorporated by reference.

BACKGROUND

1. Field

This document relates to an organic light emitting display device and driving method thereof.

2. Related Art

An organic electroluminescence (EL) element used for an organic light emitting display (OLED) device is a self-emission element including a light emission layer formed between two electrodes. The organic EL element is an element in which electrons and holes are injected into the light emission layer from an electron injection electrode (e.g., cathode) and a hole injection electrode (e.g., anode), and as excitons formed as the injected electrons and holes are combined fall from an excited state to a base state, light is emitted.

The OLED device using the organic EL element may be divided into a top emission type OLED device, a bottom emission type OLED device, a dual-emission type OLED device, and the like, depending on the direction in which light is emitted. In addition, the OLED device may be divided into a passive matrix type OLED device, an active matrix type OLED device, and the like, depending on a driving method.

In the OLED device, when a scan signal, a data signal, power, and the like, are supplied to a plurality of subpixels disposed in a matrix form, selected subpixels emit light to display an image.

The OLED device, however, has a problem in that its luminance varies due to a change in current according to a panel, temperature and external light source conditions, and the like, so in order to maintain the luminance corresponding to data signals, various methods have been proposed. However, the related art luminance compensation (or adjustment) method accompanies a flickering phenomenon due to a gray level difference and degradation of display quality, which is, thus, to be solved.

SUMMARY

In an aspect, an organic light emitting display (OLED) device comprises: an estimated current calculation unit configured to estimate an increase estimated current value having at least one increased gray level and a decrease estimated current value having at least one decreased gray level with respect to current flowing cross an element; a current measurement unit configured to measure the current flowing across the element to generate a measured current value; and a luminance adjustment unit configured to compare the values supplied from the estimated current calculation unit and the current measurement unit and increase the luminance when the value inputted through the estimated current calculation unit is high and decrease the luminance when the value inputted through the estimated current calculation unit is low.

In another aspect, a method for driving an OLED device comprising: estimating current flowing across an element to obtain an estimated current value; measuring the current flowing across the element to obtain a measured current value; and when a result value obtained by adding a marginal value to or subtracting the marginal value from the measured current value is smaller than the estimated current value, reducing the luminance, when the result value is larger than the estimated current value, increasing the luminance, and when the result value is equal to the estimated current value, maintaining the luminance.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail embodiments of the invention examples of which are illustrated in the accompanying drawings.

An organic light emitting display (OLED) device and its driving method according to exemplary embodiments of the present invention will now be described in detail with reference to the accompanying drawings.

Figure 1:
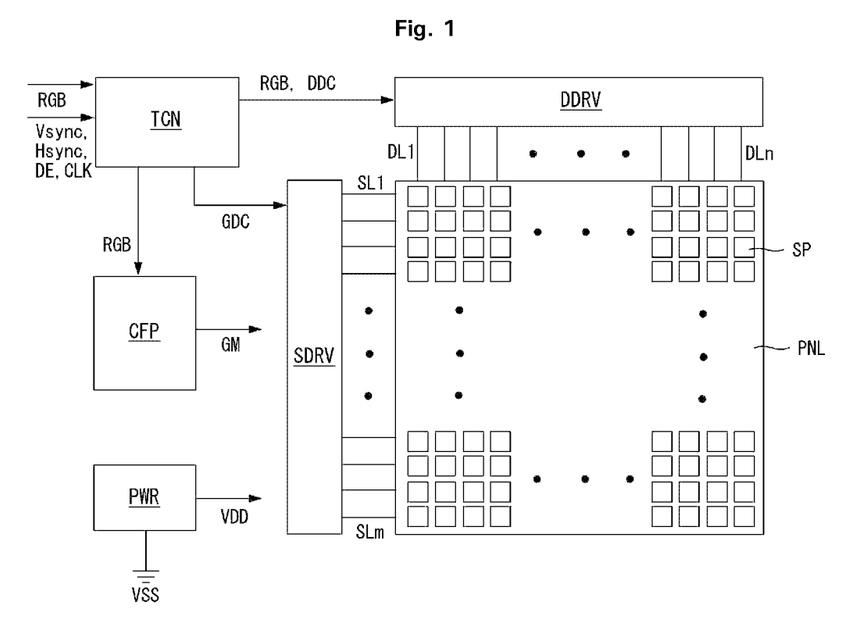
FIG. 1 is a schematic block diagram of an organic light emitting display (OLED) device according to an exemplary embodiment of the present invention.
Figure 2:
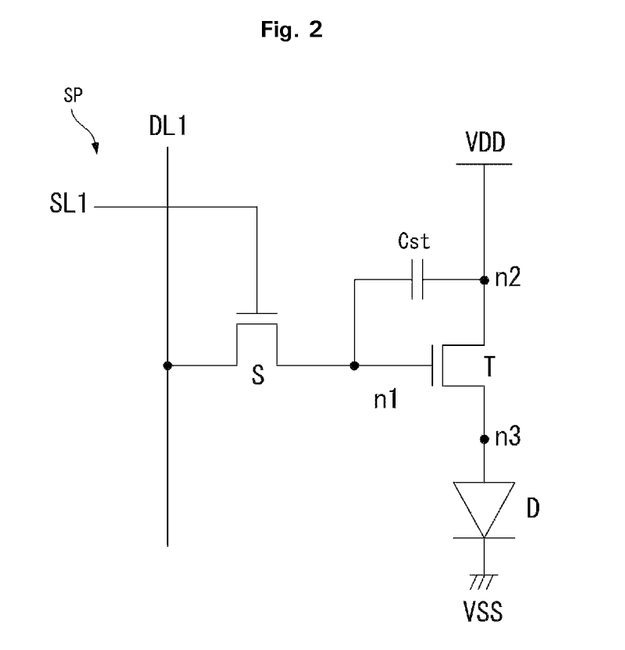
FIG. 2 illustrates the configuration of a circuit of a subpixel illustrated in FIG. 1.
Figure 3:
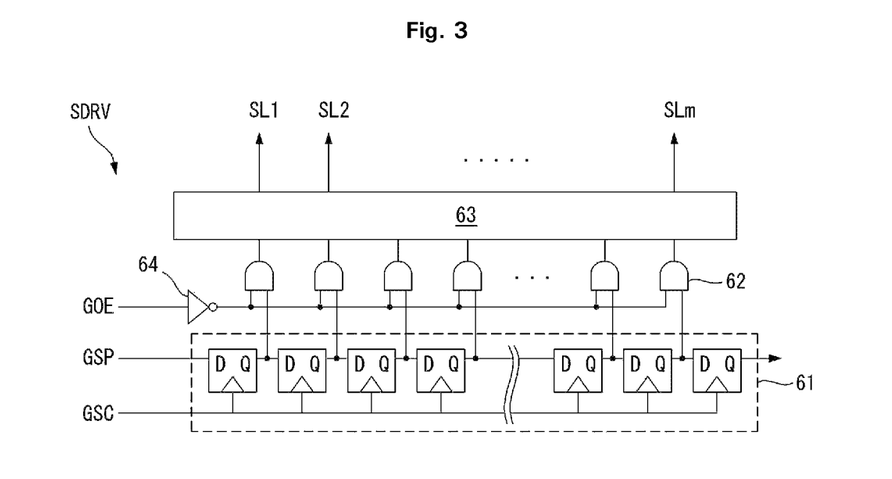
FIG. 3 is a schematic block diagram of a scan driver.
Figure 4:
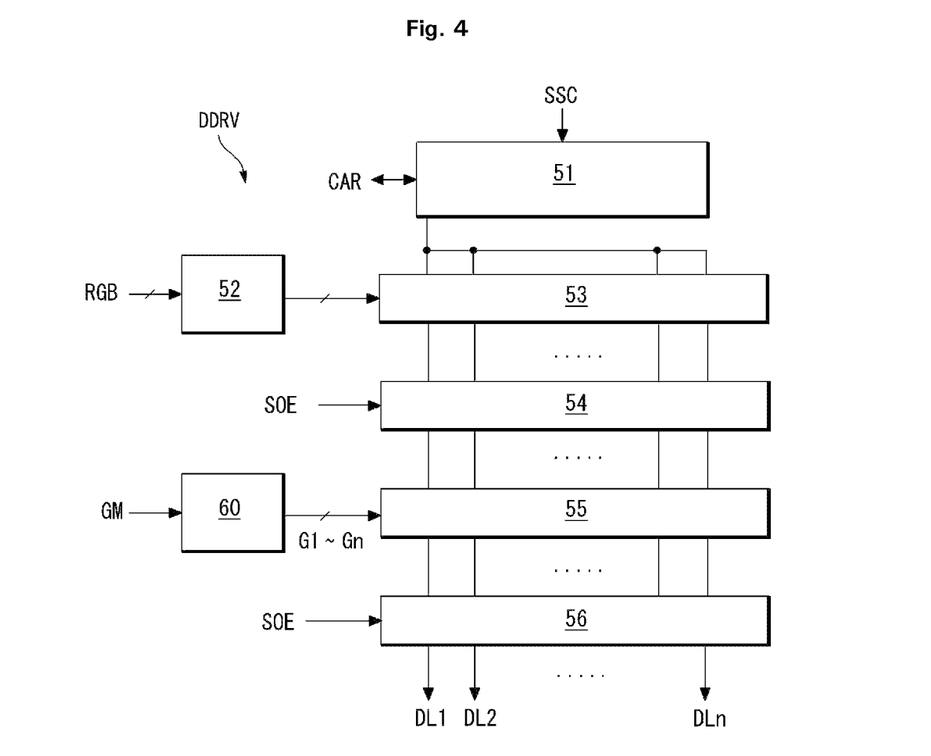
FIG. 4 is a schematic block diagram of a data driver.

FIG. 1 is a schematic block diagram of an OLED device according to an exemplary embodiment of the present invention. FIG. 2 illustrates the configuration of a circuit of a subpixel illustrated in FIG. 1. FIG. 3 is a schematic block diagram of a scan driver. FIG. 4 is a schematic block diagram of a data driver.

As shown in FIG. 1, the OLED device according to an exemplary embodiment of the present invention comprises a timing driver TCN, a display panel PNL, a power supply unit PWR, a luminance compensation unit CPF, a scan driver SDRV, and a data driver DDRV.

The timing driver TCN receives a vertical synchronous signal Vsync, a horizontal synchronous signal Hsync, a data enable signal DE, a clock signal CLK, and data signals RGB from an external source. The timing controller TCN controls an operational timing of the data driver DDRV and the scan driver SDRV by using the timing signals such as the vertical synchronous signal Vsync, the horizontal synchronous signal Hsync, the data enable signal DE, and the clock signal CLK.

In this case, because the timing driver TCN can determine a frame period by counting the data enable signal DE during a one horizontal period, the vertical synchronous signal Vsync and the horizontal synchronous signal Hsync may be omitted. Control signals generated by the timing driver TCN may comprise a gate timing control signal GDC for controlling an operational timing of the scan driver SDRV and a data timing control signal DDC for controlling an operational timing of the data driver DDRV. The gate timing control signal GDC comprises a gate start pulse GSP, a gate shift clock GSC, a gate output enable signal GOE signal, and the like. The gate start pulse GSP is supplied to a gate drive integrated circuit (IC) from which a first scan signal is generated. The gate shift clock GSC, which is a clock signal commonly inputted to gate drive ICs, is used to shift the gate start pulse GSP. The gate output enable GOE signal controls outputs of the gate drive ICs. The data timing control signal DDC comprises a source start pulse SSP, a source sampling clock SSC, a source output enable signal SOE, and the like. The source start pulse SSP controls a data sampling start point of the data driver DDRV. The source sampling clock SSC is a clock signal for controlling a sampling operation of data within the data driver DDRV based on a rising or falling edge. Meanwhile, the source start pulse SSP supplied to the data driver DDRV may be omitted according to a data transmission method.

The display panel PNL comprises subpixels SP disposed in a matrix form. The subpixels SP may be configured as a passive matrix type subpixels or active matrix type subpixels. When the subpixels SP are formed as the active matrix type subpixels, they may have a 2T (Transistor) 1C (Capacitor) structure comprising a switching transistor, a driving transistor, a capacitor, an organic light emitting diode or may have a 3T1C structure, a 4T1C structure, a 5T2C structure, and the like, comprising more transistors and capacitors. The subpixels SP having such a configuration may be formed as a top-emission type subpixels, bottom-emission type subpixels, or dual-emission type subpixels. In case of the subpixel having the 2T1C structure, it may have such a structure as shown in FIG. 2. In FIG. 2, a gate of a switching transistor S is connected to a scan line SL1 through which a scan signal is supplied, one end of the switching transistor SL1 is connected to a data line DL1 through which a data signal is supplied, and the other end of the switching transistor SL1 is connected to a first node n1. A gate of a driving transistor T is connected to the first node n1, one end of the driving transistor T is connected to a second node n2 connected to a first power line VDD to which a high potential voltage is supplied, and the other end of the driving transistor T is connected to a third node n3. One end of a capacitor Cst is connected to the first node n1 and the other end thereof is connected to the second node n2. An anode of an organic light emitting diode D is connected to the third node n3 connected to the other end of the driving transistor T and a cathode of the organic light emitting diode D is connected to a second power line VSS to which a low potential voltage is supplied. The foregoing subpixel SP may operate as follows. When a scan signal is supplied through the scan line SL1, the switching transistor S is turned on. Next, when a data signal supplied through the data line DL1 is provided to the first node 1 through the turned-on switching transistor S, the data signal is stored as a data voltage in the capacitor Cst. And then, when the scan signal is interrupted and the switching transistor S is turned off, the driving transistor T is driven according to the data voltage stored in the capacitor Cst. Thereafter, when a high potential voltage supplied through the first power line VDD flows through the second power line VSS, the organic light emitting diode D emits light. However, this operation is one of examples of driving methods, and the present invention is not meant to be limited thereto. Also, the transistors S and T included in the subpixel are configured as N type transistors, but the present invention is not meant to be limited thereto.

The power supply unit PWR generates a high potential voltage and a low potential voltage based on power source voltages provided from an external source, and supplies the generated high potential voltage and the low potential voltage to the subpixels SP through the high potential power line VDD and the low potential power line VSS. The power supply unit PWR may provide power also to the data driver DDRV or the scan drive SDRV, as well as to the subpixels SP.

The luminance compensation unit CFP estimates an increase estimated current value having at least one increased gray level and a decrease estimated current value having at least one decreased gray level with respect to the current flowing across an element, and measures the current flowing across the element to obtain a measured current value. The luminance compensation unit CFP compares the estimated current values and the measured current value. If the estimated current values are higher than the measured current value, the luminance compensation unit CFP generates a luminance compensation signal GM for increasing the luminance, and if the estimated current values are lower than the measured current value, the luminance compensation unit CFP generates a luminance compensation signal GM for decreasing the luminance. In order to obtain the estimated current values, the luminance compensation unit CFP may receive the data signals RGB from the timing driver TCN or may receive current (or voltage) fed back from the power line VDD or VSS connected to the element included in the subpixels SP. The luminance compensation unit CFP may be included in the timing driver TCN. The luminance compensation unit CFP will be described in more detail later.

The scan driver SDRV sequentially generates scan signals while shifting the levels of the signals with a swing width of a gate driving voltage with which the transistors of the subpixels SP included in the display panel PNL can operate in response to the gate timing control signal GDC provided from the timing driver TCN. The scan driver SDRV supplies the generated scan signals through scan lines SL1~SLm to the subpixels SP included in the display panel PNL. As shown in FIG. 3, the scan driver SDRV comprises gate drive ICs. The gate drive ICs comprise a shift register 61, a level shifter 63, a plurality of AND gates connected between the shift register 61 and the level shifter 63, an inverter 64 for inverting the gate output enable signal GOE, and the like, respectively. The shift register 61 sequentially shifts gate pulses GSP according to the gate shift clock GSC by using a plurality of dependently connected D-flipflops. The AND gates 62 AND an output signal of the shift register 61 and an inverse signal of the gate output enable signal GOE to generate an output. The inverter 64 inverts the gate output enable signal GOE and supplies the same to the AND gates 62. The level shifter 63 shifts an output voltage swing width of the AND gates 62 to a scan voltage swing width with which the transistors included in the display panel PNL can operate. The scan signal outputted from the level shifter 63 is sequentially supplied to the scan lines SL1~SLm. Meanwhile, the shift resistor 61 may be formed along with the transistors on the display panel PNL in the process of manufacturing the transistors included in the display panel PNL. In this case, the level shifter 63 may be formed along with the timing driver TCN or may be formed on a printed circuit board (PCB) along with source drive ICs, rather than being formed on the display panel PNL.

In response to the data timing control signal DDC provided from the timing controller TCN, the data driver DDRV samples the digital data signals RGB supplied from the timing driver TCN and latches the same to convert them into data of a parallel data system. In converting the signal into the data of a parallel data system, the data driver DDRV converts the digital data signal RGB into a gamma reference voltage and then converts the gamma reference voltage into an analog data signal. The data driver DDRV supplies the converted data signal to the subpixels SP included in the display panel PNL through the data lines DL1~DLn. As shown in FIG. 4, the data driver DDRV comprises source drive ICs. The source drive ICs comprise a shift register 51, a data register 52, a first latch 53, a second latch 54, a converter 55, an output circuit 56, and the like, respectively. The shift register 51 shifts the source sampling clock SSC provided from the timing driver TCN. The shift register 51 delivers a carrier signal CAR to a shift register of a source drive IC of a neighboring next stage. The data register 52 temporarily stores the digital data signals RGB provided from the timing driver TCN and supplies them to the first latch 53. The first latch 53 samples the digital data signals RGB inputted in series according to clocks sequentially supplied from the shift register 51, latches the same, and simultaneously outputs the latched data. The second latch 54 latches the data provided from the first latch 53, and simultaneously outputs the latched data in synchronization with second latches of other source drives ICs in response to the source output enable signal SOE. The converter 55 maps the digital data signals RGB inputted from the second latch 54 and gamma gray scale voltages G1~Gn provided from a gamma unit 60 to convert the digital data signals into analog data signals. The output circuit supplies the analog data signals to the data lines DL1~DLn in response to the source output enable signal SOE. Meanwhile, the gamma unit 60 sets a gamma reference voltage according to the luminance compensation signal GM provided from the luminance compensation unit CFP or varies gamma gray scale levels (digital gamma) to output varied gamma gray scale voltages G1~Gn. The gamma unit 60 may be included in the data driver DDRV but not limited thereto.

The OLED device according to an exemplary embodiment of the present invention will now be described in more detail.

Figure 5:
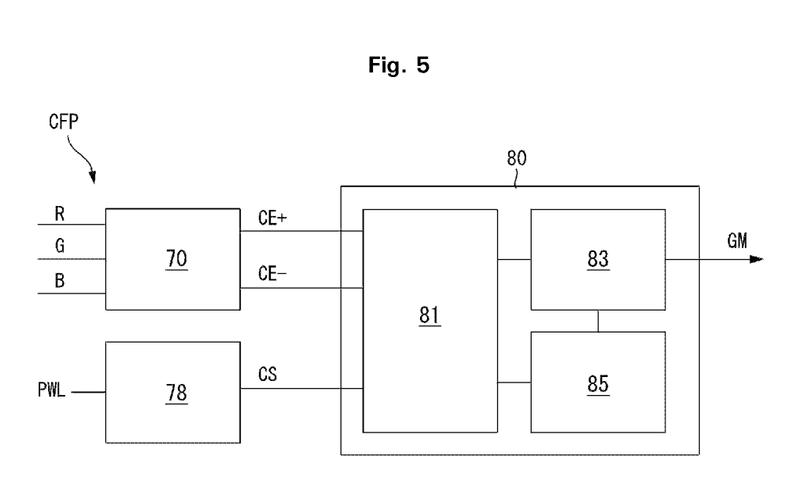
FIG. 5 is a schematic block diagram of a luminance compensation unit according to an exemplary embodiment of the present invention.
Figure 6:
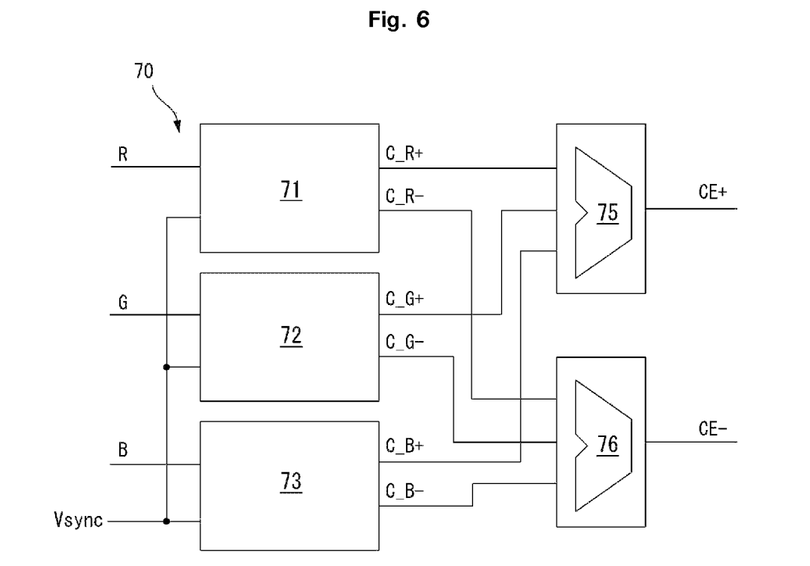
FIG. 6 is schematic block diagram of an estimated current calculation unit illustrated in FIG. 5.
Figure 7:
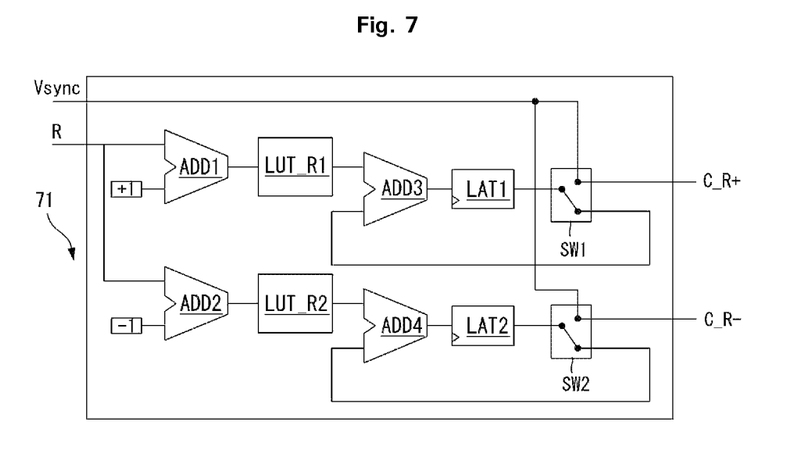
FIG. 7 is a schematic block diagram of a current adding unit illustrated in FIG. 6.

FIG. 5 is a schematic block diagram of a luminance compensation unit according to an exemplary embodiment of the present invention. FIG. 6 is schematic block diagram of an estimated current calculation unit illustrated in FIG. 5. FIG. 7 is a schematic block diagram of a current adding unit illustrated in FIG. 6.

As shown in FIG. 5, the luminance compensation unit CFP comprises an estimated current calculation unit 70, a current measurement unit 78, and a luminance adjustment unit 80.

The estimated current calculation unit 70 estimates an increase estimated current value CE+ having one increased gray level and a decrease estimated current value CE− having one decreased gray level with respect to the current flowing across an element. In this case, the estimated current calculation unit 70 estimates the estimated current values CE+ and CE− by using the data signals RGB provided from the timing driver TCN.

The current measurement unit 78 measures the current flowing across the element to obtain a measured current value CS. The current measurement unit 78 may receive current (or voltage) fed back through a power sensing line PWL connected to the power line VDD or VSS connected to the element included in the subpixels SP, and generates the measured current value CS by using the feedback current (or voltage).

The luminance adjustment unit 80 compares the values provided from the estimated current calculation unit 70 and the current measurement unit 78, and generates the luminance compensation signal GM for increasing the luminance when the value inputted through the estimated current calculation unit 70 is higher, and decreasing the luminance when the value inputted through the estimated current calculation unit 70 is lower. The luminance adjustment unit 80 comprises a comparing unit 81, an adjustment unit 83, and a controller 85. The comparing unit 81 compares the values provided from the estimated current calculation unit 70 and the current measurement unit 78 and supplies corresponding results values to the controller 85. The controller 85 generates control signals according to the result values provided from the comparing unit 81, and supplies it to the adjustment unit 83. The adjustment unit 83 generates the luminance compensation signal GM for increasing the luminance when the estimated current is higher and decreasing the luminance when the estimated current is lower according to the control signals provided from the controller 85.

The luminance compensation signal GM generated by the luminance adjustment unit 80 is divided into a luminance increase value for increasing the luminance and a luminance decrease value for decreasing the luminance, and these values are provided to the gamma unit 60 included in the data driver DDRV. The gamma unit 60 sets the gamma reference voltage based on the luminance compensation signal GM or varies the gamma gray scale levels to output varied gamma gray scale voltages G1~Gn. Then, a final data signal outputted from the data driver DDRV is a luminance-compensated data signal and as such it is supplied to each subpixel SP. Meanwhile, if the value provided from the estimated current calculation unit 70 and the value provided from the current measurement unit 78 are equal, the luminance adjustment unit 80 regards that there is no luminance difference, so it omits an output of the luminance compensation signal GM to allow the gamma unit 60 to maintain a current luminance.

As shown in FIG. 6, the estimated current calculation unit 70 comprises red, green, and blue current adding units 71, 72, and 73, an increased current adding unit 75, and a decreased current adding unit 76.

The red, green, and blue current adding units 71, 72, and 73 generate increments C_R+, C_G+, C_B+ and decrements C_R−, C_G−, C_B− with respect to the current value flowing across the red R, green G, and blue B elements, respectively. In this case, the red, green, and blue current adding units 71, 72, and 73 can generate the increments C_R+, C_G+, C_B+ and the decrements C_R−, C_G−, C_B− with respect to the current value flowing across the red R, green G, and blue B elements, respectively, by using the vertical synchronous signal Vsync provided from the timing driver TCN.

The increased current adding unit 75 adds the increments C_R+, C_G+, C_B+ inputted from the red, green, and blue current adding units 71, 72, and 73 to obtain the increase estimated current value CE+.

The decreased current adding unit 76 adds the decrements C_R−, C_G−, C_B− inputted from the red, green, and blue current adding units 71, 72, and 73 to obtain the decrease estimated current value CE−.

Here, the increase estimated current value CE+ corresponds to an estimated current when the luminance is increased by one gray level, and the decrease estimated current value CE− corresponds to an estimated current when the luminance is decreased by one gray level.

The red, green, and blue current adding units 71, 72, and 73 included in the estimated current calculation unit 70 may be configured like the red current adding unit 71 as shown in FIG. 7. The red current adding unit 71 obtains the current values with respect to an input gray level by accumulating them during at least one frame, and converts them into the increment C_R+ and the decrement C_R− through look-up tables LUT_R. To this end, the red current adding unit 71 comprises first adders ADD1 and ADD2, look-up tables LUT_R1 and LUT_R2, second adders ADD3 and ADD4, latches LAT1 and LAT2, and switching elements SW1 and SW2. The first adders ADD1 and ADD2 add or subtract the current value with respect to the input gray level with +1 and −1. The lookup tables LUT_R1 and LUT_R2 convert the current values inputted from the first adders ADD1 and ADD2 into the increment C_R+ and the decrement C_R− based on the stored data. The second adders ADD3 and ADD4 add or subtract the increment C_R+ and the decrement C_R− inputted from the look-up tables LUT_R1 and LUT_R2 and transfer the same to the latches LAT1 and LAT2. The latches LAT1 and LAT2 add up the increment C_R+ and the decrement C_R− inputted from the look-up tables LUT_R1 and LUT_R2 during at least one frame, and output the same to a non-display interval with reference to the vertical synchronous signal Vsync. Here, the non-display interval may be defined as a vertical blank interval (VBI) that comes after the one frame ends, but not limited thereto.

In the present exemplary embodiment, when the luminance adjustment unit 80 compares the values provided from the estimated current calculation unit 70 and the current measurement unit 78, it may compare them by adding an adjustment value or a marginal value calculated based on a noise value and a luminance value generated in obtaining the measured current value. By comparing the values provided from the estimated current calculation unit 70 and the current measurement unit 78 by adding the adjustment value or the marginal value, the luminance compensation signal GM can be generated by applying an adaptive variation value according to the states (temperature, an external light source condition, and the like) of the display panel PNL, so the luminance can be compensated for while preventing the occurrence of a flickering phenomenon.

The luminance compensation unit CFP according to the present exemplary embodiment as described above may be implemented in the following form.

Figure 8:
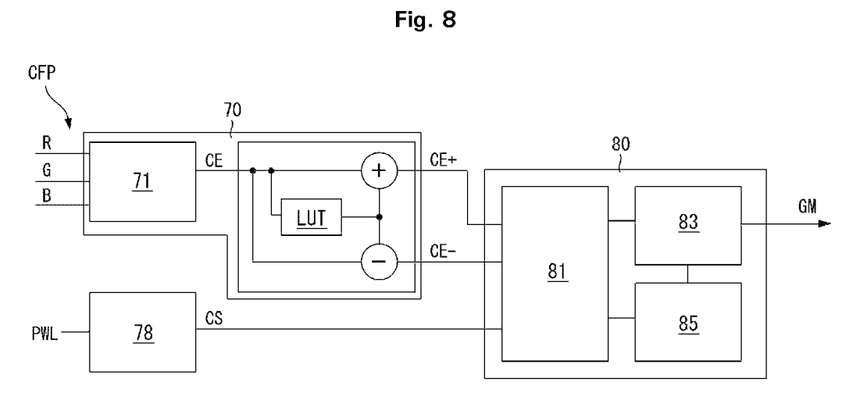
FIG. 8 is a schematic block diagram of a luminance compensation unit according to another exemplary embodiment of the present invention.

FIG. 8 is a schematic block diagram of a luminance compensation unit CPF according to another exemplary embodiment of the present invention.

As shown in FIG. 8, the luminance compensation unit CPF comprises the estimated current calculation unit 70, the current measurement unit 78, and the luminance adjustment unit 80. Here, the current measurement unit 78 and the luminance adjustment unit 80 are configured in the same manner as those of the former exemplary embodiment, while the estimated current calculation unit 70 is configured to be different. That is, the estimated current calculation unit 70 comprises an estimation unit 71 for estimating the current flowing across an element and a look-up table unit LUT for drawing (or obtaining) an increase estimated current value CE+ and a decrease estimated current value CE− according to the current CE estimated by the estimation unit 71.

The look-up table unit LUT comprises increase estimated current data obtained by adding an increment with respect to the current values flowing across the red, green, and blue elements so that the increase estimated current value CE+ can be drawn or obtained according to the estimated current value CE which has been generated by the estimation unit 71. Also, the look-up table LUT comprises decrease estimated current data obtained by adding a decrement with respect to the current values flowing across the red, green, and blue elements so that the decrease estimated current value CE− can be drawn or obtained according to the estimated current value CE which has been generated by the estimation unit 71. The increase estimated current data and the decrease estimated current data included in the look-up table unit LUT may be obtained based on data acquired through experimentation in advance in order to obtain adaptive variation values according to the estimated current value CE. By configuring the luminance compensation unit CFP in this manner, the luminance can be compensated for while preventing the occurrence of a flickering phenomenon without increasing the cost for configuring the device.

A driving method (i.e., an algorithm) that can be applicable in implementing the OLED device according to an exemplary embodiment of the present invention will now be described.

Figure 9:
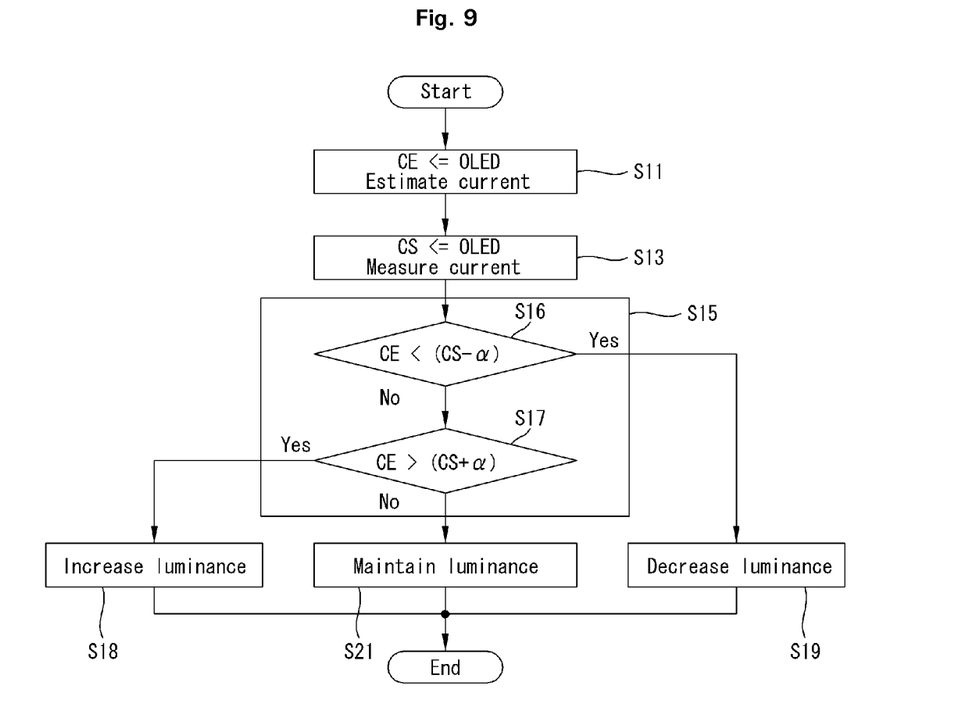
FIG. 9 is a flow chart illustrating the process of a method for driving an OLED device according to an exemplary embodiment of the present invention.

FIG. 9 is a flow chart illustrating the process of a method for driving an OLED device according to an exemplary embodiment of the present invention.

First, current flowing across the element OLED is estimated to obtain an estimated current value CE S11. The estimated current value CE may be obtained by adding up the data signals supplied to the element OLED during at least one frame, but not limited thereto. In this case, the estimated current value CE may be obtained to be within a range smaller than or equal to the current flowing across the element OLED.

The current flowing across the element OLED is measured to obtain a measured current value CS S13. The measured current value CS may be obtained based on the current (or voltage) fed back from the power line VDD or VSS of the element OLED, but not limited thereto.

Next, a result value obtained by adding a marginal value (α) to the measured current value CS or subtracting it from the measured current value CS is smaller than the estimated current value CE, the luminance is reduced S19. When the result value is greater than the estimated current value CE, the luminance is increased S18. When the result value is equal to the estimated current value CE, the luminance is maintained S21.

The marginal value (α) is calculated by adding or subtracting one gray level from the estimated current value CE and the luminance value (gray). The marginal value (α) is calculated by Equation 1 shown below:

$$\alpha = \sum_{frame} LUT_{CE}(\text{gray}^+) - \sum_{frame} LUT_{CE}(\text{gray}) \quad [\text{Equation 1}]$$
$$(\text{Hereafter, } CE < CS)$$
$$= \sum_{frame} LUT_{CE}(\text{gray}) - \sum_{frame} LUT_{CE}(\text{gray})^-$$
$$(\text{Hereafter, } CE > CS)$$
$$\text{Hereafter, } CE = \sum_{frame} LUT_{CE}(\text{gray})$$

In Equation 1, α is a marginal value, LUT is a value for estimating current flowing across a transistor with respect to a gray level input used in obtaining the estimated current value, gray+ is a corresponding gray level when the luminance value is increased by one gray level, gray− is a corresponding ray level when the luminance value is decreased by one gray level, CE is the estimated current value, CS is the measured current value, and $$\sum_{frame}$$

is the sum of at least one frame.

As noted from the above description, the driving method according to an exemplary embodiment of the present invention is performed to generate the luminance compensation value for making the estimated current value CE and the measured current value CS equal (i.e., "CE=CS"). After the luminance compensation value is generated in this manner, the gamma can be adjusted by using the generated luminance compensation value. Then, the occurrence of a flickering phenomenon, which otherwise occurs in compensating the luminance by using the feedback current, can be prevented, and thus, display quality of the display panel can be improved.

The driving method according to an exemplary embodiment of the present invention can be applicable as an example of a driving algorithm of the luminance compensation unit CFP illustrated in FIG. 8, but not limited thereto.

Figure 10:
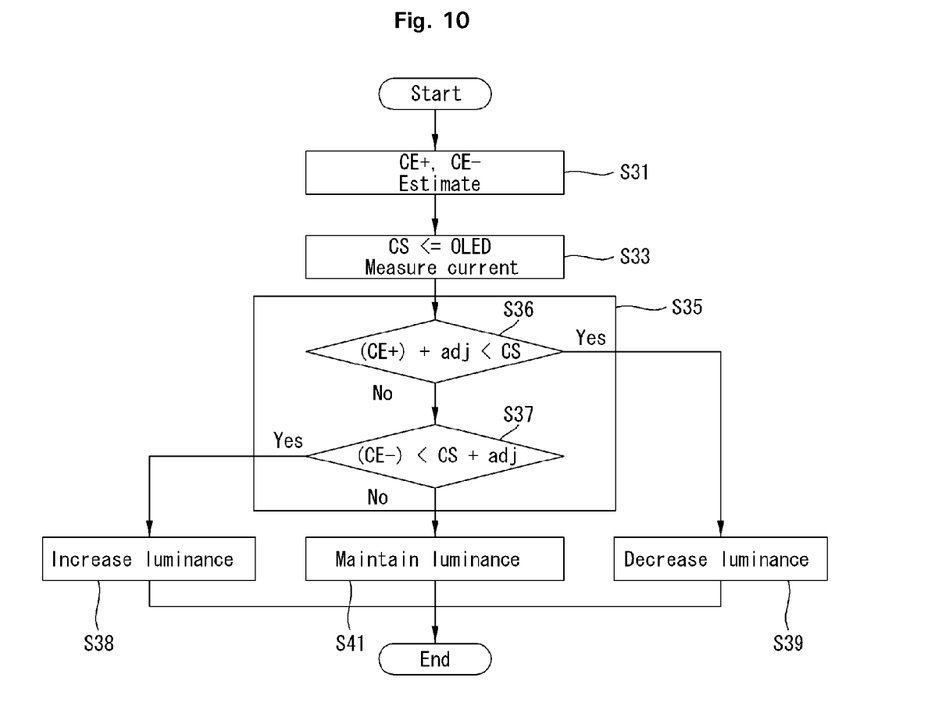
FIG. 10 is a flow chart illustrating the process of a method for driving an OLED device according to another exemplary embodiment of the present invention.

FIG. 10 is a flow chart illustrating the process of a method for driving an OLED device according to another exemplary embodiment of the present invention.

First, an increase estimated current value CE+ having at least one increased gray level and a decrease estimated current value CE− having at least one decreased gray level with respect to the current flowing across the element OLED are estimated S31. The estimated current value CE may be obtained by adding up the data signals supplied to the element OLED during at least one frame, but not limited thereto. In this case, the estimated current value CE may be obtained to be within a range smaller than or equal to the current flowing across the element OLED.

The current flowing across the element OLED is measured to obtain a measured current value CS S33. The measured current value CS may be obtained based on the current (or voltage) fed back from the power line VDD or VSS of the element OLED, but not limited thereto.

Next, when a first result value obtained by adding an adjustment value adj to the increase estimated current value CE+ is smaller than the measured current value CS, the luminance is decreased S39. When a second result value obtained by adding the adjustment value adj to the measured current value CS is greater than the decreased estimated current value CE−, the luminance is increased S38. When the first result value or the second result value is equal to the measured current value CS, the luminance is maintained S41.

The adjustment value adj may have a value calculated by the noise value and the luminance value generated in drawing or obtaining the measured current value CS, but not limited thereto.

The increase estimated current value CE+ and the decrease estimated current value CE− may be calculated by Equation 2 shown below:

$$CE^+ = \sum_{frame} LUT_{CE}(\text{gray}^+) \quad [\text{Equation 2}]$$

$$CE^- = \sum_{frame} LUT_{CE}(\text{gray}^-)$$

In Equation 2, CE+ is the increase estimated current value, CE−1 is the decrease estimated current value, gray+ is a corresponding gray level when the luminance value is increased by one gray level, gray− is a corresponding ray level when the luminance value is decreased by one gray level, LUT is a value for estimating current flowing across a transistor with respect to a gray level input used in obtaining the estimated current value, and $$\sum_{frame}$$

is the sum of at least one frame.

After the luminance compensation value is generated in this manner, the gamma can be adjusted by using the generated luminance compensation value. Then, the occurrence of a flickering phenomenon, which otherwise occurs in compensating the luminance by using the feedback current, can be prevented, and thus, display quality of the display panel can be improved.

The driving method according to another exemplary embodiment of the present invention can be applicable as an example of a driving algorithm of the luminance compensation unit CFP illustrated in FIG. 5, but not limited thereto.

The experimentation results according to an exemplary embodiment of the present invention will now be described.

Figure 11:
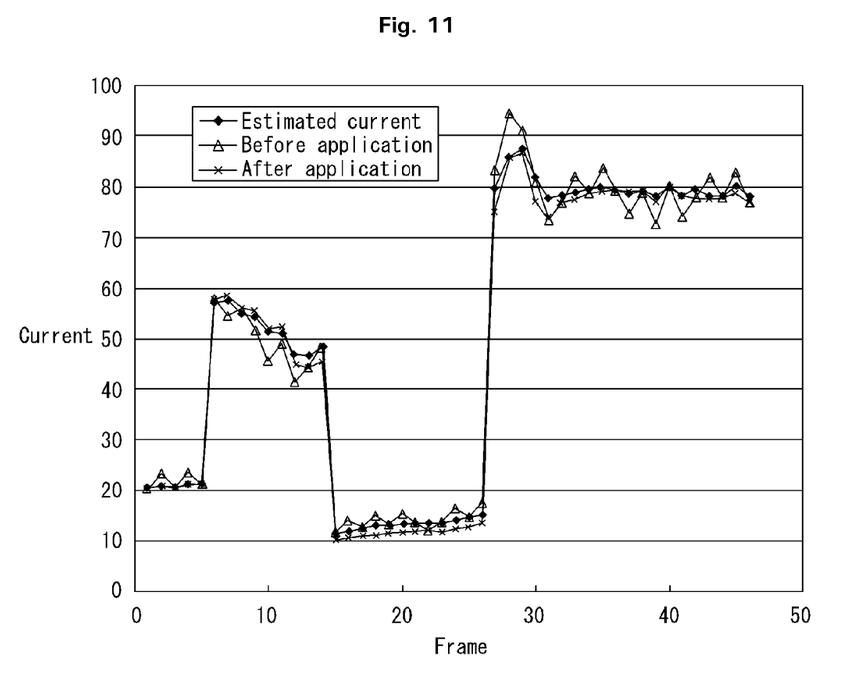
FIG. 11 is a graph showing current waveforms observed from a display panel according to experimentation results according to an exemplary embodiment of the present invention.

FIG. 11 is a graph showing current waveforms observed from a display panel according to experimentation results according to an exemplary embodiment of the present invention.

As shown in FIG. 11, before the embodiment of the present invention is applied, as the luminance is higher or as the luminance is greatly changed, a strong flickering phenomenon occurs according to the variation of current. In comparison, however, after the embodiment of the present invention is applied, the estimated current is supplied with the substantially same current flow without causing a flickering phenomenon, unlike the case before the embodiment of the present invention is applied. Therefore, the use of device and method according to exemplary embodiments of the present invention can implement a current feedback type OLED device which is resistant to an environment change and is capable of compensating for the luminance in an adaptive manner, while preventing the occurrence of flickering due to a gray level difference.

As described above, the OLED device and its driving method according to the exemplary embodiments of the present invention have the advantages in that the luminance can be adaptively compensated for according to the state of the display panel and the environment conditions, while preventing the occurrence of a flickering phenomenon due to a gray level difference, so the display quality of the display panel can be improved.

What is claimed is:

1. An organic light emitting display (OLED) device, comprising:
    an estimated current calculation unit configured to determine an increase estimated current value having at least one increased gray level and a decrease estimated current value having at least one decreased gray level with respect to current flowing cross an element;
    a current measurement unit configured to measure the current flowing across the element to provide a measured current value; and
    a luminance adjustment unit configured to compare the values supplied from the estimated current calculation unit and the current measurement unit and increase the luminance when the value inputted through the estimated current calculation unit is high and decrease the luminance when the value inputted through the estimated current calculation unit is low, wherein the estimated current calculation unit comprises:
- red, green, and blue current adding units configured to provide an increment and a decrement of each of current values flowing across red, green, and blue elements,
- an increased current adding unit configured to add the increments inputted from the red, green, and blue current adding units to obtain the increase estimated current value, and
- a decreased current adding unit configured to add the decrements inputted from the red, green, and blue current adding units to obtain the decrease estimated current value, wherein the red, green, and blue current adding units add up the current values during the at least one frame by using a synchronous signal supplied from a timing driving unit and outputs the increment and the decrement to the non-display interval, wherein the estimated current calculation unit further comprises:
- an estimation unit configured to determine the current flowing across the element; and
- a look-up table unit configured to obtain the increase estimated current value and the decrease estimated current value according to the estimated current value provided by the estimation unit, and wherein the look-up table unit comprises:
- an increase estimated current data comprising the respective increments with respect to the current values flowing across the red, green, and blue elements to allow for obtaining the increase estimated current value according to the estimated current value provided by the estimation unit, and
- a decrease estimated current data comprising the respective decrements with respect to the current values flowing across the red, green, and blue elements to allow for obtaining the decrease estimated current value according to the estimated current value provided by the estimation unit.

2. The device of claim 1, wherein, when the value provided from the estimated current calculation unit and the value provided from the current measurement unit are equal, the luminance adjustment unit maintains the luminance.

3. The device of claim 1, wherein the luminance adjustment unit is further configured to:
- provide a luminance increase value for increasing the luminance and a luminance decrease value for decreasing the luminance; and
- supply the luminance increase value and the luminance decrease value to a gamma unit in order to allow the luminance to be compensated for based on the luminance increase value and the luminance decrease value.

4. The device of claim 1, wherein, when the luminance adjustment unit compares the values supplied from the estimated current calculation unit and the current measurement unit the luminance adjustment unit is further configured to add an adjustment value obtained based on a noise value and a luminance value generated in obtaining the measured current value to compare the values.

5. The device of claim 1, wherein:
the estimated current calculation unit comprises a red, green, and blue current adding units; and
the red, green, and blue current adding units comprise:
- two first adders add or subtract the current value with respect to the input gray level with +1 and −1;
- two lookup tables convert the current values inputted from the two first adders into the increment and the decrement based on the stored data;
- two second adders add or subtract the increment and the decrement inputted from the two look-up tables; and
- two latches add up the increment and the decrement inputted from the two look-up tables during at least one frame, and output the same to a non-display interval with reference to the vertical synchronous signal.

6. A method for driving an organic light emitting display (OLED) device, the method comprising:
determining current flowing across an element to obtain an increase estimated current value having at least one increased gray level and a decrease estimated current value having at least one decreased gray level;
measuring the current flowing across the element to obtain a measured current value; and
when a result value obtained by adding a marginal value to or subtracting the marginal value from the measured current value is smaller than the estimated current value, reducing the luminance, when the result value is larger than the estimated current value, increasing the luminance, and when the result value is equal to the estimated current value, maintaining the luminance, wherein the estimated current value is obtained by a look-up table, wherein the look-up table obtains the increase estimated current value and the decrease estimated current value according to the estimated current value, wherein the look-up table comprises:
- an increase estimated current data comprising the respective increments with respect to the current values flowing across the red, green, and blue elements to allow for obtaining the increase estimated current value according to the estimated current value provided by the estimating operation; and
- a decrease estimated current data comprising the respective decrements with respect to the current values flowing across the red, green, and blue elements to allow for obtaining the decrease estimated current value according to the estimated current value provided by the estimating operation.

7. The method of claim 6, wherein the marginal value is calculated by adding one gray level to or subtracting one gray level from the estimated current value and the luminance value, and the marginal value is calculated by the equation shown below:

$$\alpha = \sum_{frame} LUT_{CE}(gray^+) - \sum_{frame} LUT_{CE}(gray) \text{ (Hereafter, } CE < CS\text{)}$$

$$= \sum_{frame} LUT_{CE}(gray) - \sum_{frame} LUT_{CE}(gray^-) \text{ (Hereafter, } CE > CS\text{)}$$

$$\text{Hereafter, } CE = \sum_{frame} LUT_{CE}(gray)$$

wherein:
'α' is the marginal value,
LUT is a value for estimating current flowing across a transistor with respect to a gray level input used in obtaining the estimated current value,
gray+ is a corresponding gray level when the luminance value is increased by one gray level,
gray− is a corresponding ray level when the luminance value is decreased by one gray level,
CE is the estimated current value,
CS is the measured current value, and $$\sum_{frame}$$

is the sum of at least one frame.

8. A method for driving an organic light emitting display (OLED) device, the method comprising:
determining current flowing across an element to obtain an increase estimated current value having at least one increased gray level and a decrease estimated current value having at least one decreased gray level;
measuring the current flowing across the element to obtain a measured current value; and
when a first result value obtained by adding an adjustment value to the increase estimated current value is smaller than the measured current value, decreasing the luminance, when a second result value obtained by adding the adjustment value to the measured current value is greater than the decrease estimated current value, increasing the luminance, and when the first result value or the second result value are equal to the measured current value, maintaining the luminance,
wherein the estimated current value is obtained by a look-up table,
wherein the look-up table obtains the increase estimated current value and the decrease estimated current value according to the estimated current value, and
wherein the look-up table comprises:
an increase estimated current data comprising the respective increments with respect to the current values flowing across the red, green, and blue elements to allow for obtaining the increase estimated current value according to the estimated current value provided by the estimating operation, and
a decrease estimated current data comprising the respective decrements with respect to the current values flowing across the red, green, and blue elements to allow for obtaining the decrease estimated current value according to the estimated current value provided by the estimating operation.

9. The method of claim 8, wherein the increase estimated current value and the decrease estimated current value are calculated by the equation shown below:

$$CE^+ = \sum_{frame} LUT_{CE}(gray^+)$$

$$CE^- = \sum_{frame} LUT_{CE}(gray^-)$$

wherein:
CE+ is the increase estimated current value, CE−1 is the decrease estimated current value,
gray+ is a corresponding gray level when the luminance value is increased by one gray level,
gray− is a corresponding ray level when the luminance value is decreased by one gray level,
LUT is a value for estimating current flowing across a transistor with respect to a gray level input used in obtaining the estimated current value, and $$\sum_{frame}$$

is the sum of at least one frame.

10. The method of claim 8, wherein the adjustment value is calculated based on a noise value and a luminance value provided in drawing the measured current value.

11. The device of claim 1, wherein the increase estimated current value and the decrease estimated current value are calculated by the equation shown below:

$$CE^+ = \sum_{frame} LUT_{CE}(gray^+)$$

$$CE^- = \sum_{frame} LUT_{CE}(gray^-)$$

wherein:
CE+ is the increase estimated current value,
CE−1 is the decrease estimated current value, gray+ is a corresponding gray level when the luminance value is increased by one gray level,
gray− is a corresponding ray level when the luminance value is decreased by one gray level,
LUT is a value for estimating current flowing across a transistor with respect to a gray level input used in obtaining the estimated current value, and $$\sum_{frame}$$

is the sum of at least one frame.

* * * * *